United States Patent [19]
Kalb, Jr.

[11] Patent Number: 5,760,581
[45] Date of Patent: Jun. 2, 1998

[54] METHOD AND APPARATUS COUPLING TOGETHER MAGNETO FIELD EFFECT TRANSISTORS IN SERIES TO ACCUMULATE THE EFFECTS OF MAGNETIC FIELD FOR IMPROVED SENSITIVITY AND LINEARITY

[75] Inventor: Jeffrey C. Kalb, Jr., Phoenix, Ariz.

[73] Assignee: Intel Corporation, Santa Clara, Calif.

[21] Appl. No.: 718,625

[22] Filed: Sep. 17, 1996

[51] Int. Cl.$^6$ .................... G01R 33/06; H03K 17/687; H03K 17/90; H01L 27/22

[52] U.S. Cl. ............................. 324/252; 327/510

[58] Field of Search ........................... 324/252; 257/252, 257/421, 423, 427; 327/510

[56] References Cited

U.S. PATENT DOCUMENTS

| | | |
|---|---|---|
| 4,100,563 | 7/1978 | Clark . |
| 4,677,380 | 6/1987 | Popovic et al. ............... 324/252 |
| 4,683,429 | 7/1987 | Popovic . |
| 4,700,211 | 10/1987 | Popovic et al. . |
| 4,710,704 | 12/1987 | Ando . |
| 4,893,073 | 1/1990 | McDonald et al. . |
| 4,926,116 | 5/1990 | Talisa . |
| 5,153,557 | 10/1992 | Partin et al. . |
| 5,247,278 | 9/1993 | Pant et al. . |
| 5,392,293 | 2/1995 | Hsue . |
| 5,489,846 | 2/1996 | Li et al. .................... 324/252 |

OTHER PUBLICATIONS

"An Evaluation of IDDQ Versus Conventional Testing for CMOS Sea-of-Gate IC's". K. Sawada and S. Kayano, *ASIC Design Engineering Center, Mitsubishi Electric Corporation*, 1992 IEEE.

"IDDQ Testing Makes a Comeback", Dan Ramanchik, *Test & Measurement World*, Oct., 1993, p. 58.

"Built-In Current Testing—Feasibility Study", Wojciech Maly and Phil Nigh, *Department of Electrical and Computer Engineering, Carnegie Mellon University*, 1988 IEEE.

"Master Series IDDQ Product Description–R0.4–Preliminary Jan. 1994", *Master Series IDDQ Monitor*, Copyright 1991/1992, LTX Corporation.

Built–in Current Sensor for IDDQ Test in CMOS, Ching–Wen Hsue and Chih–Jen Lin, *AT&T Bell Laboratories*, 1993 IEEE.

(List continued on next page.)

*Primary Examiner*—Walter E. Snow
*Attorney, Agent, or Firm*—Blakely, Sokoloff, Taylor & Zafman

[57] ABSTRACT

A circuit including daisy chain coupled triple drain magneto field effect transistors (MagFETs) for measuring magnetic field. The disclosed method and apparatus describe multiple MagFETs coupled together to accumulate voltage differentials generated in response to magnetic field. A lateral drain of a first triple drain MagFET is used to bias the gate of a second triple drain MagFET. The center drains and sources of each MagFET are biased with well matched current sources which permit the center drains and sources of each MagFET to float to a corresponding voltage biasing each triple drain MagFET near threshold. With the gate of each MagFET biased by a lateral drain of a prior MagFET, and with the source of each MagFET permitted to float to approximately a threshold voltage less than the corresponding gate voltage, the generated voltage differentials by each MagFET are accumulated thereby resulting in increased sensitivity to magnetic field. In addition, with the increased sensitivity, each MagFET is permitted to operate in a lower magnetic flux region resulting in improved overall linearity of differential voltage versus magnetic flux with the present invention.

19 Claims, 8 Drawing Sheets

OTHER PUBLICATIONS

"Circuit Design for Built-In Current Testing", Yukija Miura and Kozo Kinoshita, *Department of Applied Physics, Osaka University*, 1992 IEEE.

"A General Purpose IDDQ Measurement Circuit", Kenneth M. Wallquist, Alan W. Righter and Charles F. Hawkins, *Electrical & Computer Engineering Department, The University of New Mexico*, 1993 International Test Conference.

"IDDQ and Reliability", Robert C. Aitken, *Design Technology Center, Palo Alto, California*, Apr. 26, 1994, Hewlett-Packard.

"IDDQ Background Paper on Sematech/Sandia/UNM Project", Alan Righter & Chuck Hawkins, Apr. 4, 1994, *The University of New Mexico Electrical and Computer Engineering Dept.*

FIG_1 (PRIOR ART)

FIG_2A (PRIOR ART)

FIG_2B (PRIOR ART)

FIG_3

FIG_4

FIG_5

FIG_6

FIG_7

METHOD AND APPARATUS COUPLING TOGETHER MAGNETO FIELD EFFECT TRANSISTORS IN SERIES TO ACCUMULATE THE EFFECTS OF MAGNETIC FIELD FOR IMPROVED SENSITIVITY AND LINEARITY

BACKGROUND OF THE INVENTION

1. Field of the Invention

The present invention relates generally to magnetic field sensors and more specifically, the present invention relates to magnetic field effect transistors.

2. Description of the Related Art

Magnetic field sensors are used in a number of industries today. For example, in the medical industry, magnetic field sensors are useful in magnetic imaging technology. In the electronics industry, magnetic field sensors are used in circuits to measure magnetic fields produced by electric currents or the earth's magnetic field.

A wide variety of types of magnetic field sensors may be used to measure the flux of a magnetic field. Hall Effect magnetic field sensors are presently used in many applications in which it is desired to measure a magnetic flux. These magnetic field sensors convert magnetic flux into a signal in the form of a differential voltage which may then be manipulated in accordance with conventional methods of analog circuit design. An important property of magnetic field sensors is this sensitivity of the sensor to magnetic flux.

Figure 1:
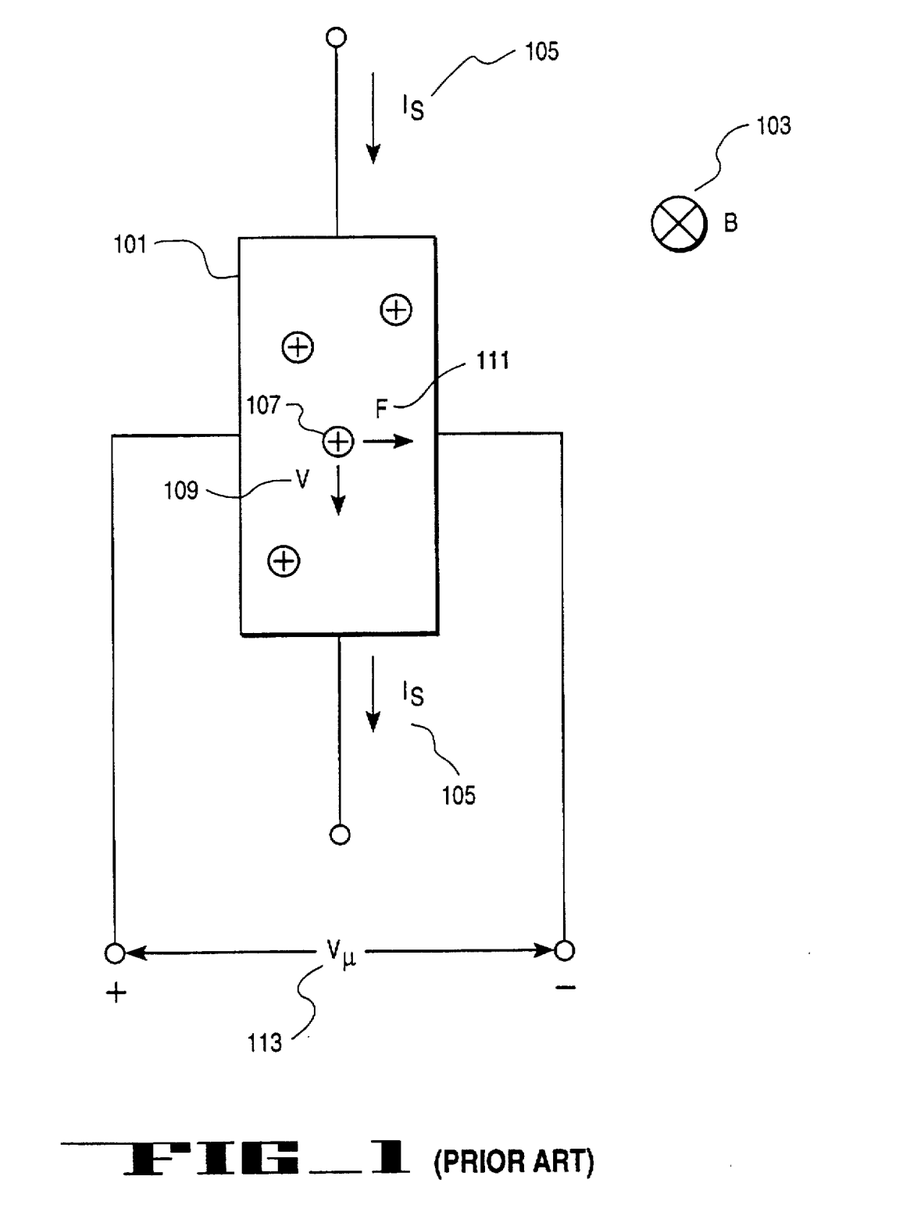
FIG. 1 is an illustration of a conductive strip exhibiting the properties of the Hall effect.

FIG. 1 is an illustration of a conductive strip 101 exhibiting the properties of the Hall Effect in response to a magnetic field 103. A sense current $I_S$ 105 flows through the conductive strip 101. Conductive strip 101 contains many charge carriers 107 which flow through conductive strip 101 with a velocity shown as V 109. It is noted that in FIG. 1, charge carrier 107 is shown as a "hole" and therefore flows in the same direction as $I_S$ 105. Charge carrier 107 may also be an electron and in such a case would therefore flow in an opposite direction of $I_S$ 105, and V 109 would correspondingly point in the opposite direction. With magnetic field B 103, flowing "into the page" in this example, a Lorentz force is exerted upon moving charged carrier 107, shown as F 111 in FIG. 1. The Lorentz force equation is given by the following relationship:

$$F = qV \times B \quad \text{(Equation 1)}$$

Where F is the Lorentz force, q is an electric charge, V is the velocity vector of the moving charge carrier and B is the magnetic field vector. Charge carrier 107 will be deflected from its normal course with an acceleration which is proportional to the charge on the carrier, q, the magnetic field, B 103, and the component of the charge carrier's velocity, V 109, which is perpendicular to the magnetic field. This acceleration will be in a direction perpendicular to both the velocity V 109 of the charge carrier and the magnetic field B 103 at that position in space as determined by the right-hand rule.

If such a magnetic field were to exist within a semiconductor in which a current is flowing, this acceleration will result in a deflected current as a result of the Lorentz force. Such a current would result in a continuous increase in local charge density unless it is compensated by an opposing current. This opposing current is developed due to the electric field which such a charge creates. This acceleration due to electric field will, in the static case, precisely balance the local acceleration due to the Lorentz force. This electric field implies a voltage drop:

$$V_H = \int E \cdot dl \quad \text{(Equation 2)}$$

Where $V_H$ is a Hall voltage and E is the electric field.

In the case of the conductive strip 101 shown in FIG. 1, the Hall voltage $V_H$ may be determined using the following Hall effect relationship:

$$V_H = \frac{I_S B_l}{n q_0 h} \quad \text{(Equation 3)}$$

where $I_S$ is the current, $B_l$ is the magnetic field, n is the density of charge carriers in the conductive strip, $q_0$ is the value of an electronic charge which is $1.602 \times 10^{-19}$ coulombs, and h is the thickness of the conductive strip. In accordance with Equation 3, it is observed that the Hall voltage $V_H$ is inversely proportional to the charge carrier density n in the conductive strip and directly proportional to the sense current $I_S$.

One type of magnetic field sensor which utilizes the Hall effect to measure magnetic flux is a magnetic field effect transistor (MagFET). MagFETs are transistors that have a gate, source and drain which use the application of a gate voltage to selectively control the carrier concentration in the conductive channel in the silicon region below the gate. By this means, a transistor may be biased to minimize the carrier concentration n below the gate to produce the largest optimal Hall voltage possible in accordance with Equation 3 above.

Figure 2A:
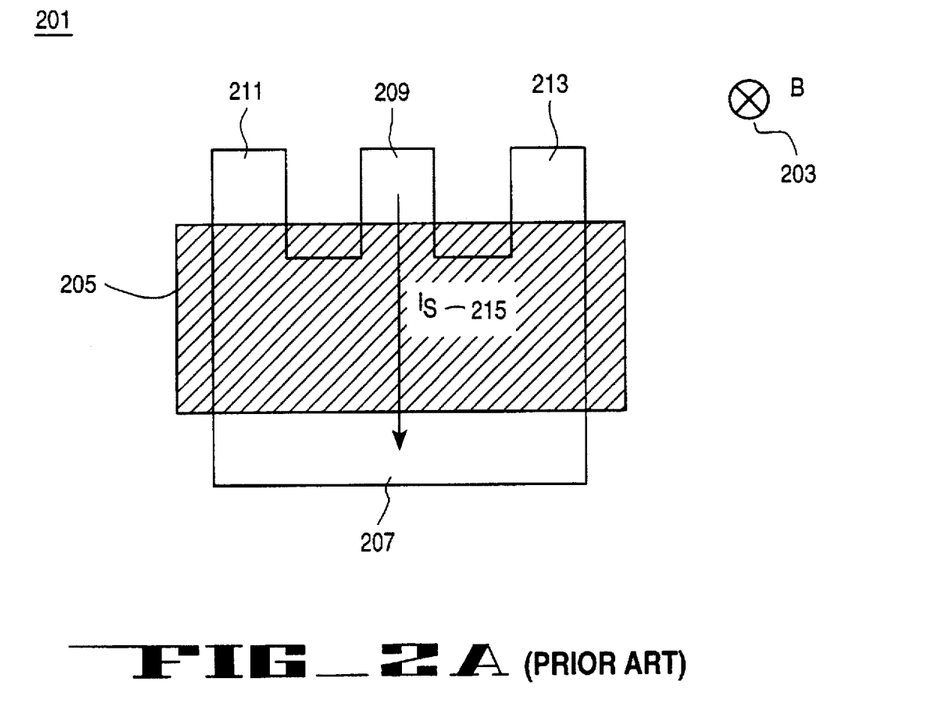
FIG. 2A is an illustration of a prior art triple drain MagFET.

FIG. 2A shows a triple drain MagFET 201 which is used to measure the flux of a magnetic field B 203. Similar to ordinary field effect transistors, MagFET 201 has a gate 205 and source 207. MagFET 201 also has three drains, center drain 209 and two lateral drains 211 and 213. A sense current $I_S$ 215 is configured to pass through the center drain 209 to the source 207 as determined by the biasing point of the gate 205. This gate voltage simultaneously determines the carrier concentration of the silicon surface. With the presence of magnetic field B 203, a voltage differential develops between the lateral drains 211 and 213 as a result of the Hall effect. The differential voltage generated between the two lateral drains shown in FIG. 2, is proportional to the component of the magnetic field B 203 perpendicular to the "page."

Figure 2B:
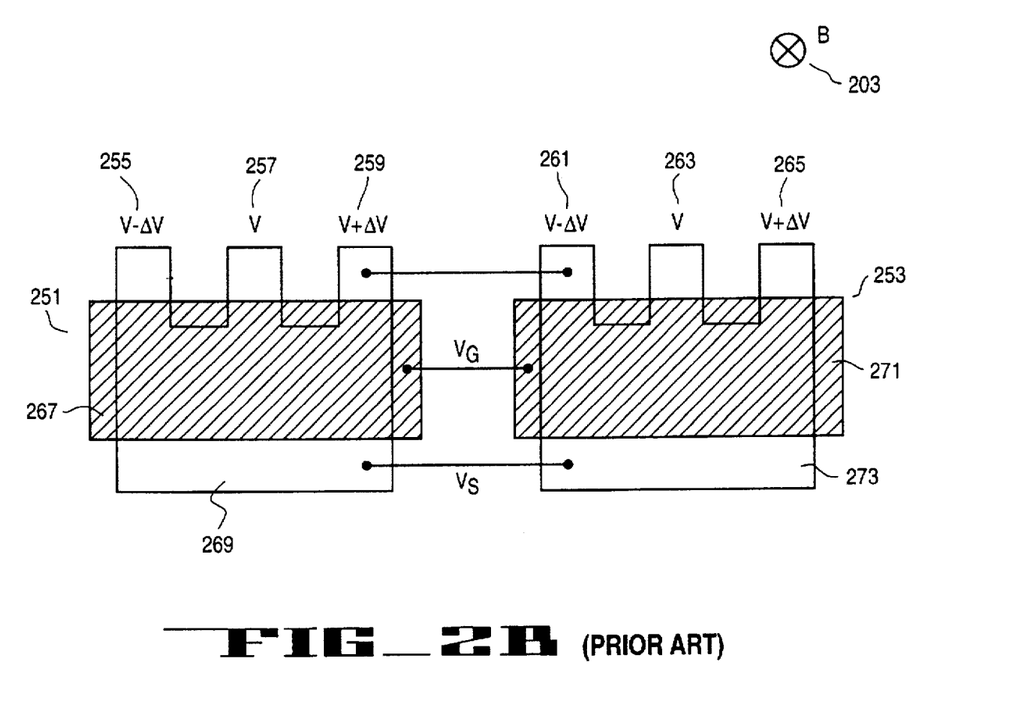
FIG. 2B is an illustration of two MagFETs coupled together in a prior art configuration.

As mentioned earlier, an important property of magnetic field sensors is the sensitivity of the sensor to magnetic flux. In the triple drain MagFET 201 shown in FIG. 2A, increased sensitivity to magnetic flux would be produced as an increase in differential voltage between lateral drains 211 and 213. FIG. 2B shows an attempt to increase sensitivity or amplification of differential voltages produced in response to a magnetic field B 203. With the intention of accumulating the effects of magnetic flux, MagFETs 251 and 253 are coupled together in a daisy-chained configuration. That is, lateral drain 259 is coupled to lateral drain 261, gate 267 is coupled to gate 271 and source 269 is coupled to source 273.

A problem with the configuration shown in FIG. 2B is that no significant new Hall voltage will be added to the differential voltage between lateral drains 255 and 265 when each MagFET 251 and 253 has been separately optimized. The problem is that the gates and sources of MagFETs 251 and 253 are in common. Each succeeding device loads down the prior one, sinking current from the first lateral drain 259 to the second lateral drain 261. The current which can be sourced is sufficient to eliminate the voltage differential due to the high output resistance of the first MagFET 251. In effect, the configuration is simply a different geometry and is equivalent to widening the MagFET.

Viewing the first MagFET 251 as a driver and the second MagFET 253 as a load, the problem is that the output impedance of lateral drain 259 is substantially equal to the input impedance of lateral drain 261.

Therefore, the common mode which connects lateral drains 259 and 261 is the mid-point of a voltage-divider which divides the voltages generated at each respective lateral drain. That is, since lateral drain 259 is being driven to V+ΔV and since lateral drain 261 is being driven to V−ΔV, coupling the lateral drains 259 and 261 together results in each lateral drain being driven to V. A current across each of the MagFETs 251 and 253 maintains this voltage. Consequently, no appreciable increase in Hall voltage may be accumulated with the configuration shown in FIG. 2B.

Thus, what is desired is a magnetic field sensing circuit which enables MagFETs to be coupled together and provides improved sensitivity to magnetic flux as a result. Such a circuit would provide an increased input impedance to a second MagFET which loads the first MagFET. With such a configuration, MagFETs may be daisy chained to accumulate the effects of magnetic field and therefore increase sensitivity to magnetic flux.

SUMMARY OF THE INVENTION

An apparatus and method for measuring magnetic fields is disclosed. In one embodiment, the gate of a first MagFET is configured to be biased at a reference voltage with the gate to source voltage of the first MagFET configured to be substantially equal to the threshold voltage. The gate of a second MagFET is coupled to a second lateral drain of the first MagFET with the gate to source to voltage of the second MagFET also configured to be substantially equal to the threshold voltage. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method and an apparatus coupling together magnetic field effect transistors (MagFETs) for measuring magnetic field is described. In the following detailed description, numerous specific details are set forth in order to provide a thorough understanding of the present invention. It will be apparent, however, to one having ordinary skill in the art that these specific details need not be employed to practice the present invention. In other instances, well known materials or methods have not been described in order to avoid obscuring the present invention.

In the present invention, multiple MagFETs are coupled together to accumulate the effects of magnetic field at the lateral drains of daisy-chain coupled MagFETs. A lateral drain of a first MagFET is coupled to the gate of a second MagFET with minimal loading since the input impedance of a MagFET gate is effectively infinite. In addition, the voltages of the center drains and sources of the MagFETs described herein are permitted to float or vary freely to maintain the accumulated voltage difference across the MagFETs.

Figure 3:
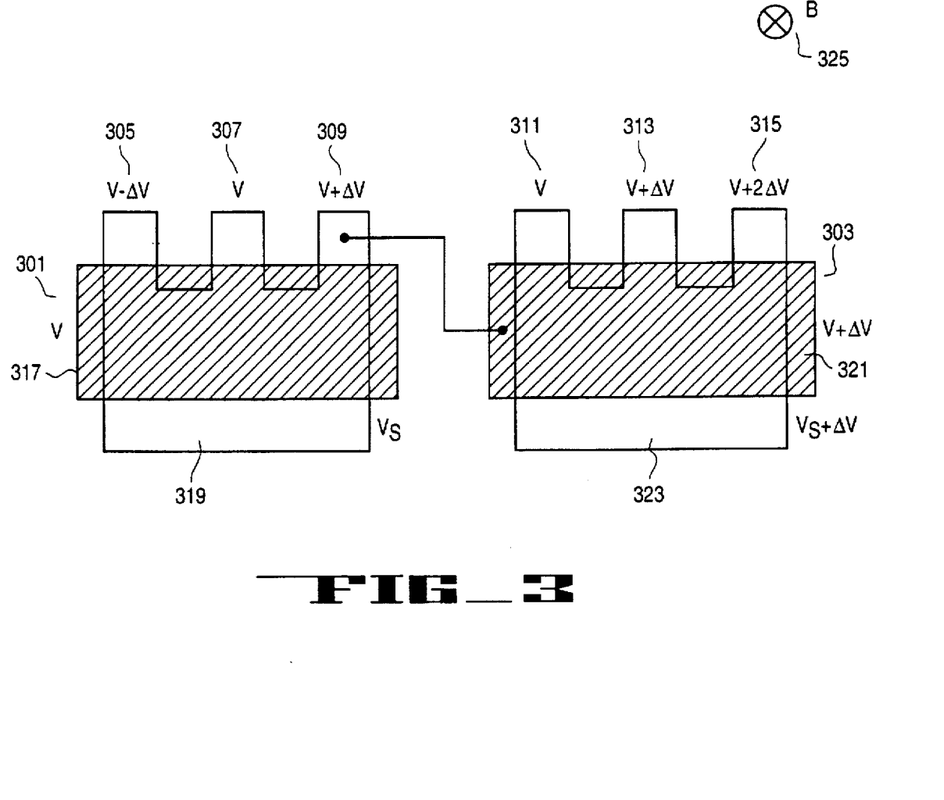
FIG. 3 is an illustration of two MagFETs coupled together in configuration in accordance with the teachings of the present invention.

FIG. 3 is an illustration of two triple drain MagFETs 301 and 303 coupled together to measure magnetic field B 325 in accordance with the teachings of the present invention. MagFET 301 has center drain 307, gate 317, source 319 and two lateral drains 305 and 309. Similarly, MagFET 303 has center drain 313, gate 321, source 323 and two lateral drains 311 and 315.

As shown in FIG. 3, lateral drain 309 of MagFET 301 is coupled to gate 321 of MagFET 303. Both MagFETs 301 and 303 are configured to measure the magnetic flux of B 325. Accordingly, the two lateral drains of each MagFET generate a differential voltage of 2ΔV centered around the voltage at the center drain of each respective MagFET. Referring to MagFET 301, gate 317 and center drain 307 are at a voltage of V and the differential voltage produced at the two lateral drains are generated as a voltage of V−ΔV at lateral drain 305 and a voltage of V−ΔV at lateral drain 309. In one embodiment, each of the MagFETs are configured to operate at threshold. Thus, the voltage at source 319 is a threshold voltage less than the voltage at the gate 317. That is, $V_S = V - V_{TN}$.

Since gate 321 has nearly infinite input impedance, there is minimal loading on lateral drain 309. As a result, the voltage at gate 321 is V+ΔV. In addition, MagFET 303 is also configured to operate at threshold. Thus, source 323 is permitted to float or vary freely to a voltage such that the voltage at source 323 is equal to a threshold voltage less than the voltage at gate 321. That is, the voltage at gate 323 is equal to $V_S$+ΔV. Similarly, center drain 313 is also permitted to vary freely and is therefore at a voltage of V+ΔV. Accordingly, the differential voltage generated in response to B 325 is produced as a voltage of V at lateral drain 311 and V+2ΔV at lateral drain 315.

Therefore, the effects of the Hall effect on MagFETs 301 and 303 are accumulated with the coupling taught by the present invention in that the voltage at lateral drain 305 is V−ΔV and the voltage at lateral drain 315 is V+2ΔV. In sum, the present invention allows the effects of magnetic field to be accumulated or amplified by coupling multiple MagFETs together as shown.

Figure 4:
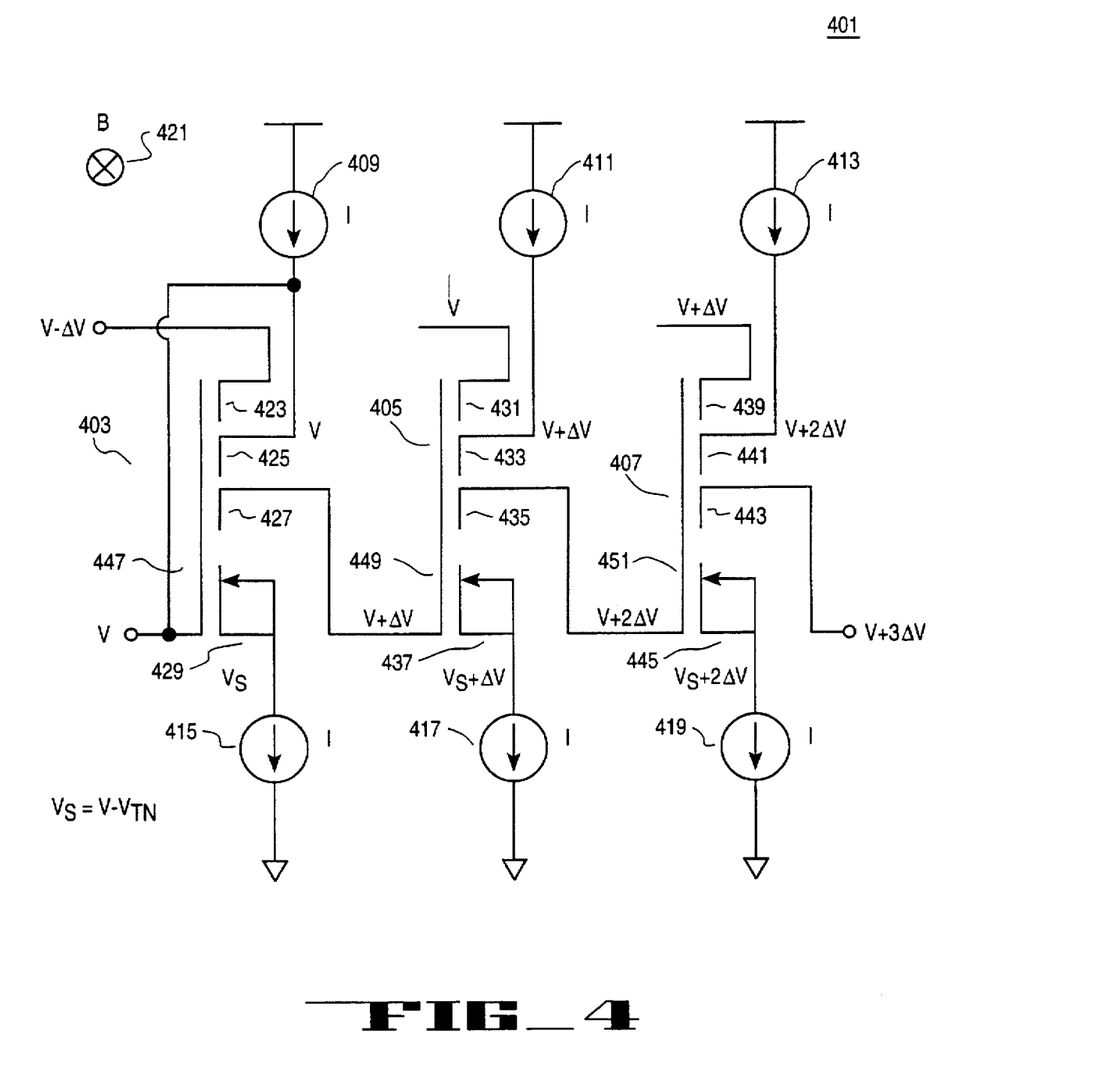
FIG. 4 is a schematic of three MagFETs coupled together in accordance with the teachings of the present invention.

FIG. 4 shows a schematic of a circuit 401 with triple drain MagFETs 403, 405 and 407 coupled together in accordance with the teachings of the present invention to measure the flux of magnetic field B 421. To permit the voltages at the center drains and sources of each of the triple drain MagFETs to float or vary freely as described earlier, current sources 409, 411, 413, 415, 417 and 419 are coupled to the center drains and sources of each tripled drain MagFET as shown in FIG. 4. Thus, center drain 425 is coupled to current source 409 and source 429 is coupled to current source 415.

Center drain 433 is coupled to current source 411 and source 437 is coupled to current source 417. Similarly, center drain 441 is coupled to current source 413 and source 445 is coupled to current source 419. With the configuration shown in FIG. 4, the center drains and sources of each triple drain MagFETs are permitted to float to the proper voltage potential as described earlier without current flowing between each of the devices. It is noted that in one embodiment of the present invention, the wells for each respective MagFET are tied to their respective sources as shown in FIG. 4.

As further shown in FIG. 4, gate 447 is coupled to center drain 425 such that both gate 447 and center drain 425 are biased at a reference voltage V. With the presence of B 421, lateral drain 423 produces a differential voltage of V−ΔV and a differential voltage of V+ΔV is generated at lateral drain 427. The voltage at source 429 is permitted to float to a voltage of $V_s$ which is equal to V−$V_{TN}$ thereby placing triple drain MagFET 403 in threshold operation. Gate 449 of triple drain MagFET 405 is biased to voltage of V+ΔV by being coupled to lateral drain 427. With the center drain 433 and source 437 of triple drain MagFET 405 coupled to current sources 411 and 417 respectively, center drain 433 is permitted to float to a voltage of V+ΔV and source 437 is permitted to float to a voltage of $V_s$+ΔV, placing triple drain MagFET 405 in threshold operation. Similar to triple drain MagFET 403, a differential voltage centered around the voltage at center drain 433 is produced in response to B 421. Accordingly, a voltage of V is generated at lateral drain 431 while a voltage of V+2ΔV is produced at lateral drain 435.

Gate 451 of triple drain MagFET 407 is biased to a voltage of V+2ΔV by being coupled to lateral drain 435. With the center drain 441 and source 445 of triple drain MagFET 407 coupled to current sources 413 and 419 respectively, the voltage at center drain 441 and source 445 are permitted to vary freely to permit triple drain MagFET 407 to operate at threshold. Thus, center drain 441 is permitted to float to a voltage of V+2ΔV and the voltage at source 445 is permitted to float to a voltage of $V_s$+2ΔV. Similar to the triple drain MagFETs described earlier, a differential voltage centered around the voltage at center drain 441 is generated at lateral drains 439 and 443. That voltage appears as V+ΔV at lateral drain 439 and V+3ΔV at lateral drain 443. Therefore, the differential voltage generated by each individual triple drain MagFET is accumulated with the present invention as a differential voltage of V−ΔV at lateral drain 423 and V+3ΔV at lateral drain 443. It is appreciated that any number of triple drain MagFETs may be daisy chained together in a similar configuration in accordance with the teachings of the present invention to accumulate the effects of magnetic field on triple drain MagFETs. With the embodiment shown in FIG. 4, the voltage differential increases by ΔV at each stage.

Figure 5:
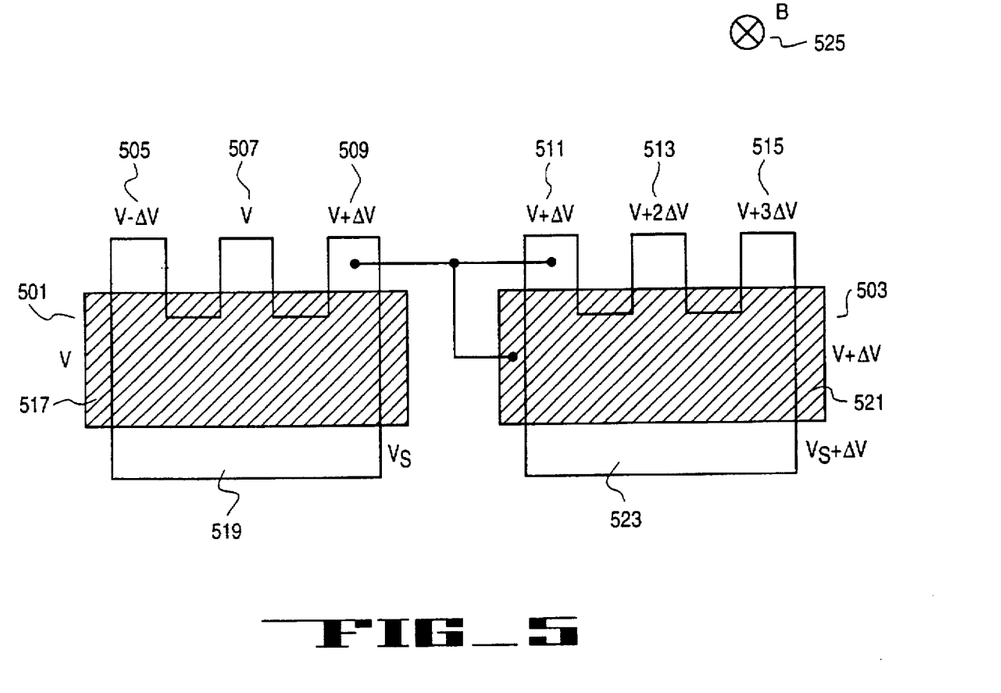
FIG. 5 is another embodiment of two MagFETs coupled together in accordance with the teachings of the present invention.

FIG. 5 is another embodiment of the present invention coupling MagFETs together to measure a magnetic field B 525. Lateral drain 509 of MagFET 501 is coupled to gate 521 and lateral drain 511 of MagFET 503. Each of the MagFETs are configured to operate at threshold. Thus, source 519 is configured to be at a threshold voltage less than the voltage at which gate 517 is biased. The differential voltage produced by each MagFET in response to B 525 is centered around the voltage present at the center drain of each particular MagFET. Accordingly, the differential voltage is generated as a voltage of V−ΔV at lateral drain 505 and a voltage of V+ΔV at lateral drain 509 of MagFET 501.

With the embodiment shown in FIG. 5, more than a ΔV voltage differential increase is generated by each stage with lateral drain 509 being coupled to gate 521 and lateral drain 511. In one embodiment of the present invention, a full 2ΔV voltage differential is realized with each stage since the gate of each MagFET determines current so strongly that each stage does not result in currents across MagFET devices. With the high input impedance of gate 521 coupled to lateral drain 509, the loading of lateral drain 509 is minimized. Furthermore, with lateral drain 511 biased to a voltage of V+ΔV and with the voltage differential generated by MagFET 503 centered around center drain 513, center drain 513 floats to a voltage of V+2ΔV and the differential voltage generated at lateral drain 515 is V+3ΔV. Similar to MagFET 501, MagFET 503 is configured to operate at threshold and source 523 is therefore permitted to float at a voltage of $V_s$+ΔV. With the embodiment shown in FIG. 5, voltage differential increases of up to 2ΔV may be realized with each stage.

Figure 6:
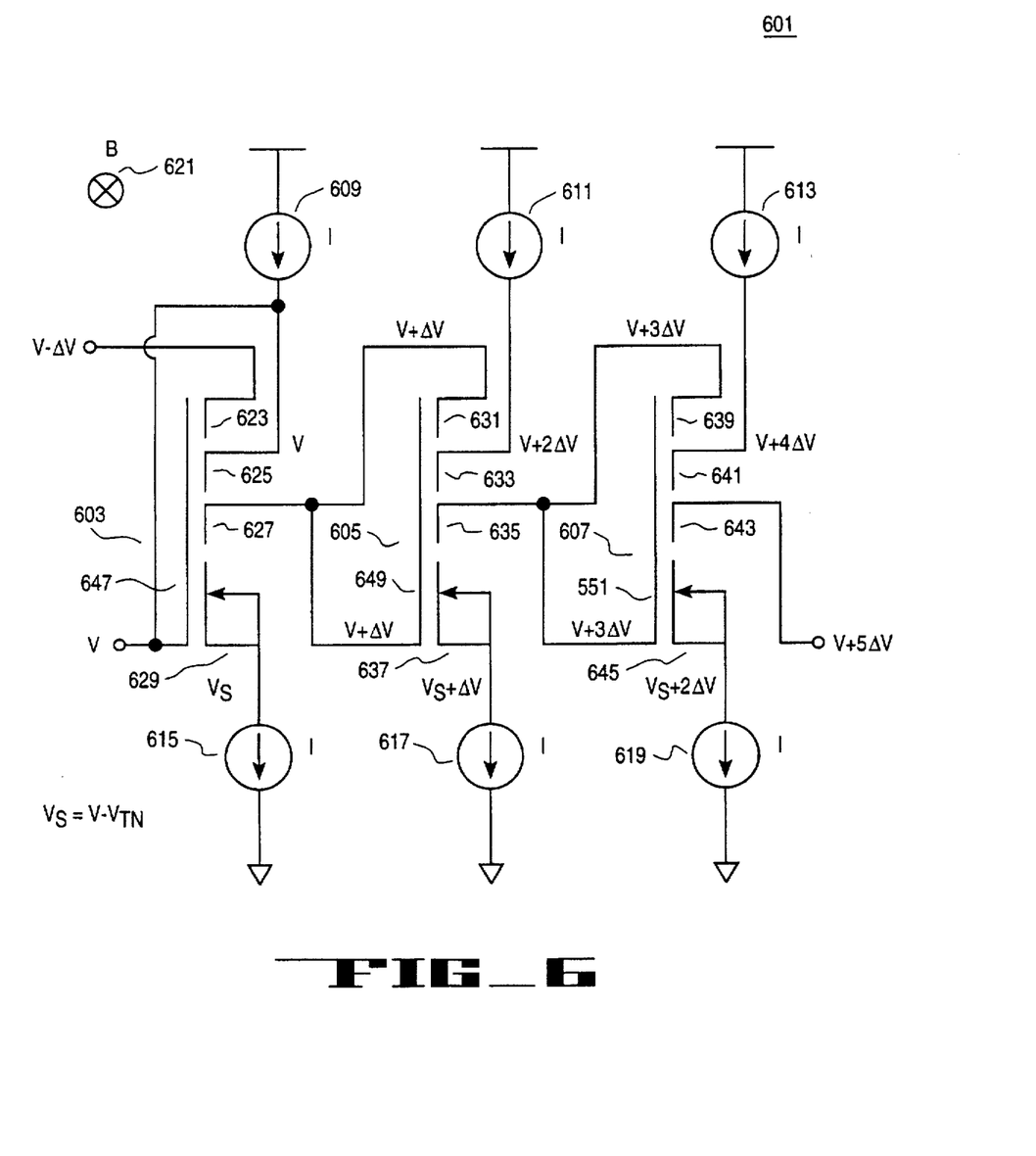
FIG. 6 is a schematic of another embodiment of the present invention showing three MagFETs coupled together in accordance with the teachings of the present invention.

FIG. 6 is a schematic of a circuit 601 in accordance with the teachings of the present invention including triple drain MagFETs 603, 605 and 607 coupled together in a daisy chain configuration to measure the flux of magnetic field B 621. The centered drain and sources of triple drain MagFETs 603, 605 and 607 are permitted to float at voltages discussed earlier with the use of well matched current sources 609, 611, 613, 615, 617 and 619 coupled to the centered drains and sources of each triple drain MagFET. That is, current source 609 is coupled to center drain 625 and current source 615 is coupled to source 629 of triple drain MagFET 603. Current source 611 is coupled to center drain 633 and current source 617 is coupled to source 637 of triple drain MagFET 605. Similarly, current source 613 is coupled to center drain 641 and current source 619 is coupled to source 645 of triple drain MagFET 607. With the MagFETs and current sources coupled as shown in FIG. 6, the center drains and sources of each MagFET are permitted to float at voltages which allow each MagFET to operate at threshold.

As shown in FIG. 6, the center drain 625 of triple drain MagFET 603 is coupled to gate 647. Gate 647 and center drain 625 are biased at a reference voltage V. With magnetic field B 621, a differential voltage centered around the voltage at center drain 625 is generated at lateral drains 623 and 627. This differential voltage is generated as V−ΔV at lateral drain 623 and V+ΔV at lateral drain 627. With triple drain MagFET 603 operating at threshold, the voltage at source 629 is a threshold voltage less than the voltage at gate 647. That is, $V_s$=V−$V_{TN}$.

Lateral drain 627 is coupled to gate 649 and lateral drain 631 of triple drain MagFET 605. As a result, lateral drain 631 and gate 649 are biased at a voltage of V+ΔV. With current source 617, source 637 of triple drain MagFET 605 is permitted to float to a voltage of $V_s$+ΔV placing triple drain MagFET 605 at threshold operation. Furthermore, in response to B 621, a voltage differential centered around a voltage at center drain 633 is generated at lateral drains 631 and 635. With lateral drain 631 biased to a voltage of V+ΔV, the voltage at center drain 633 is permitted to float to a value of V+2ΔV with current source 611. In addition, a voltage of V+3ΔV is generated at lateral drain 635.

Similar to the operation of triple drain MagFET 605, gate 651 and lateral drain 639 of triple drain MagFET 607 are biased to a voltage of V+2ΔV with current source 619. The voltage at source 645 is permitted to float to a value of $V_s$+2ΔV, placing triple drain MagFET 607 at threshold. In response to magnetic field B 621, a voltage differential centered around the voltage at center drain 641 is produced by triple drain MagFET 607 such that the voltage at center drain 641 is V+4ΔV with current source 613 and the voltage at lateral drain 643 is V+5ΔV. Thus, the effects of magnetic field B 621 are accumulated with MagFETs 603, 605 and 607 coupled as shown. The accumulated voltage differential may be appreciated in observing the voltage differential between lateral drain 623 of triple drain MagFET 603 and lateral drain 643 of triple drain MagFET 651. With a voltage of V−ΔV at lateral drain 623 and voltage of V+5ΔV at lateral drain 643, a voltage differential increase of 2ΔV is generated by each stage.

It is noted that the increase in differential voltage generated by prior art magnetic field sensor arrangements employing the Hall effect can be nonlinear with increases in magnetic flux density. This relationship is represented by line 705 in graph 701 of FIG. 7. For low levels of magnetic flux density, differential voltage increases linearly, but for large levels of magnetic flux density, the differential voltage begins to "level-off" in a nonlinear fashion. Referring for a moment back to FIG. 1, the nonlinear relationship between differential voltage and magnetic flux density can be explained in that the Lorentz force 111 continuously acts upon a moving charge carrier 107 even after the charge carrier is initially deflected from its path as indicated by V 109. That is, as B 103 becomes larger, F 111 becomes larger. With F 111 acting in a perpendicular direction to the velocity of a charge carrier 107, the charge carrier will have an increasing tendency to travel in a circular path. As a result, as the magnitude magnetic field B increases, the Hall voltage $V_H$ 113 tends to increase in a less than linear proportion.

Figure 7:
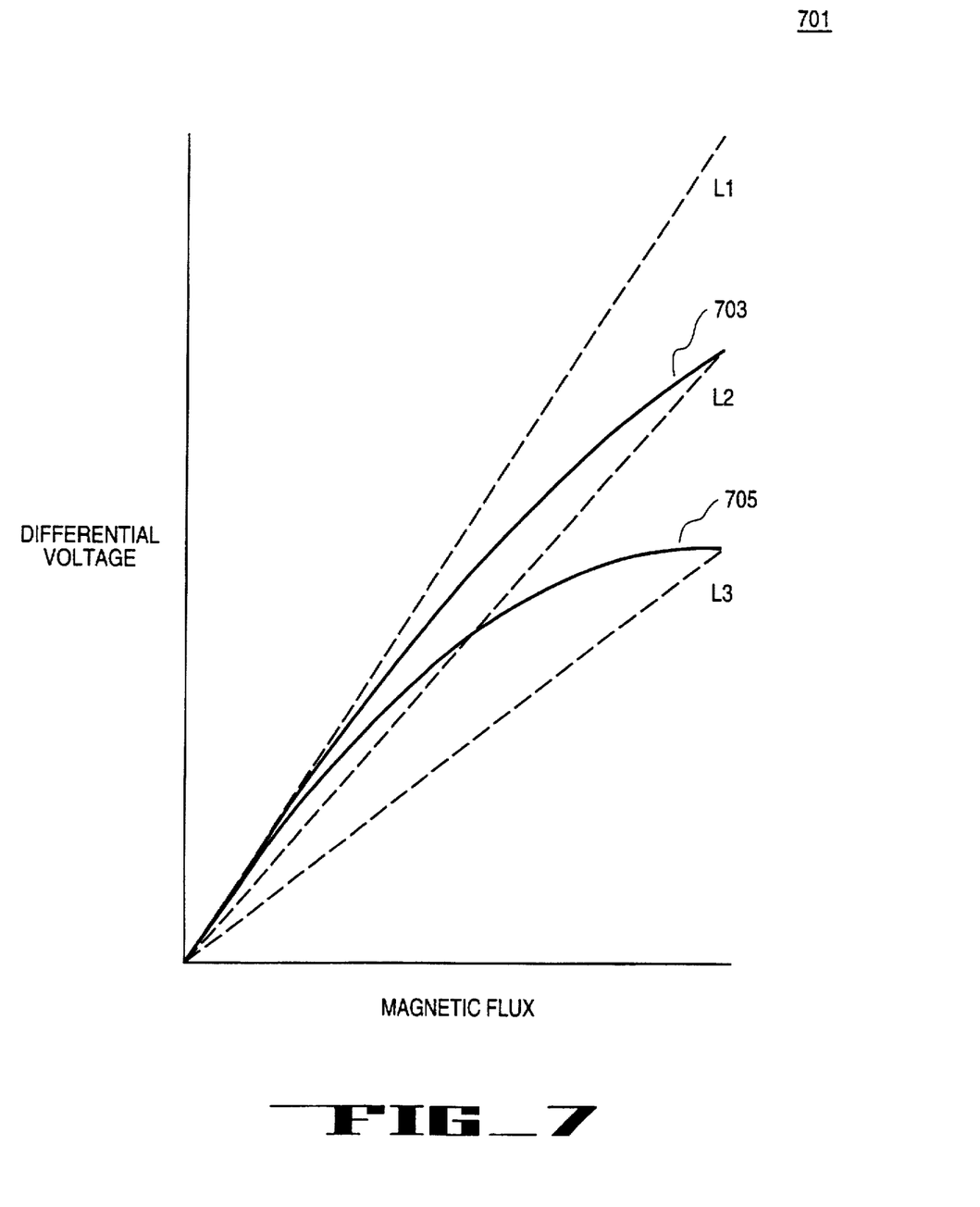
FIG. 7 is a graph showing the differential voltage versus magnetic flux relationship of MagFETs coupled together in accordance with the teachings of the present invention.

Referring back to FIG. 701, it is appreciated that with MagFETs coupled in accordance with the teachings of the present invention, improved linearity in differential voltage in relation to magnetic flux may be realized. In particular, by coupling MagFETs together as discussed herein, a magnetic flux may be distributed across each MagFET which therefore results in each MagFET operating in a lower flux density, and hence a lower and more linear region with respect to a differential voltage versus magnetic flux density relationship. By redistributing magnetic flux and coupling multiple MagFETs together to accumulate generated differential voltages, the overall differential voltage to magnetic flux relationship is more linear with the present invention.

The increased linearity which may be realized with the present invention is illustrated in line 703 of graph 701. The present invention takes advantage of the linear behavior of MagFETs at lower magnetic flux densities, yet provides amplified or accumulated differential Hall voltages generally associated with higher magnetic flux densities. As shown in FIG. 7, the differential voltage versus magnetic flux relationship of an ordinary MagFET is shown as line 705 in the region bounded by lines L1 and L3. In comparison, the differential voltage versus magnetic flux relationship of two MagFETs coupled together in accordance with the teachings of the present invention is more linear as indicated by line 703 which is in the region bounded by lines L1 and L2. Line 705 indicates the differential voltage versus magnetic flux relationship with one MagFET with B flux. Line 703 indicates the differential voltage versus magnetic flux relationship for two MagFETs coupled together in accordance with the teachings of the present invention with B/2 flux. As shown in FIG. 7, increased linearity is realized with the present invention.

This derives from a general mathematical relationship. If $f(x)$ denotes a function with downward concavity over a domain $x_i < x < x_f$, then $n \cdot f(x/n)$ will exhibit a lower degree of concavity for $n > 1$. In this particular embodiment, n is both the number of daisy chained devices and the factor by which the magnetic flux density is reduced.

Therefore, a method and an apparatus coupling together MagFET Hall devices with improved sensitivity in linearity has been described. The MagFET configuration described herein provides increased Hall voltages by accumulating voltage differentials generated by multiple MagFETs in response to magnetic fields. The present invention couples together MagFETs in a way which permits the sources and center drains of triple drain MagFETs to float by biasing them with matching current sources instead of tying them to static voltages. Daisy chaining is accomplished with the present invention by allowing the lateral drain of a previous MagFET to bias the gate of a subsequent MagFET. Since the input impedance of MagFET gates are effectively infinite, the daisy chained MagFETs described herein do not load down prior stages. In addition, the present invention permits each particular MagFET to operate in a lower magnetic flux density region thereby providing improved linearity in a differential voltage versus magnetic flux relationship.

The method and apparatus of the present invention has been described with reference to a specific exemplary embodiments thereof. It will, however, be evident that modifications and changes may be made thereto without departing from the broader spirit and scope of the present invention. The present specifications and drawings are accordingly to be regarded as illustrative rather than restrictive.

I claim:

1. An apparatus for measuring a magnetic field, the apparatus comprising:
    a first magneto field effect transistor (MagFET) having first and second lateral drains, wherein a gate of the first MagFET is configured to be biased at a reference voltage, wherein a gate to source voltage of the first MagFET is configured to be substantially equal to a threshold voltage; and
    a second MagFET, wherein a gate of the second MagFET is coupled to the second lateral drain of the first MagFET without being coupled to the gate of the first MagFET, wherein a gate to source voltage of the second MagFET is configured to be substantially equal to the threshold voltage.

2. The apparatus described in claim 1 wherein a center drain of the first MagFET is configured to be at voltage substantially equal to the reference voltage.

3. The apparatus described in claim 1 wherein the gate of the second MagFET is biased to be at a voltage substantially equal to a voltage generated by the second lateral drain of the first MagFET.

4. The apparatus described in claim 3 wherein a center drain of the second MagFET is configured to float at the voltage substantially equal to the voltage generated by the second lateral drain of the first MagFET.

5. The apparatus described in claim 1 wherein a voltage differential between the first lateral drain of the first MagFET and the second lateral drain of the second MagFET indicates a magnetic field measurement.

6. The apparatus described in claim 1 wherein a first lateral drain of the second MagFET is coupled to the second lateral drain of the first MagFET such that the first lateral drain of the second MagFET is configured to be biased at a voltage substantially equal to a voltage generated by the second lateral drain of the first MagFET.

7. The apparatus described in claim 6 wherein a voltage difference between a center drain and the gate of the second MagFET is configured to be substantially equal to a voltage difference between the center drain and the first lateral drain of the second MagFET.

8. An apparatus for measuring a magnetic field, the apparatus comprising:

a plurality of series-coupled magnetic field effect transistors (MagFETs) having first and second lateral drains, the plurality of series-coupled MagFETs configured to measure the magnetic field, the plurality of series-coupled MagFETs including:

a first one of the series-coupled MagFETs having a gate configured to be biased at a reference voltage wherein a gate to source voltage of the first one of the series-coupled MagFETs is configured to be substantially equal to a threshold voltage; and other ones of the series-coupled MagFETs, wherein each of the other ones of the series-coupled MagFETs have a gate coupled to the second lateral drain of an adjacent previous series-coupled MagFET without being coupled to a gate of the adjacent previous series-coupled MagFET, wherein a gate to source voltage of each of the other ones of the series-coupled MagFET is configured to be substantially equal to the threshold voltage;

wherein a voltage difference between the first lateral drain of the first MagFET and the second lateral drain of a last MagFET indicates a magnetic field measurement.

9. The apparatus described in claim 8 wherein a center drain of the first one of the series-coupled MagFETs is configured to be at a voltage substantially equal to the reference voltage.

10. The apparatus described in claim 8 wherein the gate of each of the other ones of the series-coupled MagFETs is biased to be at a voltage substantially equal to a voltage generated by the second lateral drain of the adjacent previous series-coupled MagFET.

11. The apparatus described in claim 10 wherein a center drain of each of the other ones of the series-coupled MagFETs is configured to float at the voltage substantially equal to the voltage generated by the second lateral drain of the adjacent previous series-coupled MagFET.

12. The apparatus described in claim 8 wherein the first lateral drain of each of the other ones of the series-coupled MagFETs is coupled to the second lateral drain of the adjacent previous series-coupled MagFET such that the first lateral drain of each of the other ones of the series-coupled MagFETs is configured to be biased at a voltage substantially equal to a voltage generated by the second lateral drain of the adjacent previous series-coupled MagFET.

13. The apparatus described in claim 12 wherein a voltage difference between a center drain and the gate of each of the other ones of the series-coupled MagFETs is configured to be substantially equal to a voltage difference between the center drain and the first lateral drain of each of the other ones of the series-coupled MagFETs.

14. A method for measuring a magnetic field, the method comprising the steps of:

biasing to a reference voltage a gate of a first magnetic field effect transistor (MagFET) having first and second lateral drains, the first MagFET configured to measure the magnetic field such that a source of the first MagFET is configured to float at a threshold voltage less than the reference voltage; and coupling the second lateral drain of the first MagFET to a gate of a second MagFET without coupling the gate of the first MagFET to the gate of second MagFET, the second MagFET configured to measure the magnetic field such that the gate of the second MagFET is configured to be biased at a voltage generated by the second lateral drain of the first MagFET, wherein a source of the second MagFET is configured to float at the threshold voltage less than the voltage generated by the second lateral drain of the first MagFET.

15. The method described in claim 14 including an additional step of configuring a center drain of the first MagFET to be at a voltage substantially equal to the reference voltage.

16. The method described in claim 15 wherein a center drain of the second MagFET is configured to float at a voltage substantially equal to the voltage generated by the second lateral drain of the first MagFET.

17. The method described in claim 14 wherein a voltage difference between the first lateral drain of the first MagFET and a second lateral drain of the second MagFET indicates a magnetic field measurement.

18. The method described in claim 14 including an additional step of coupling the second lateral drain of the first MagFET to a first lateral drain of the second MagFET such the first lateral drain of the second MagFET is configured to be biased at a voltage substantially equal to the voltage generated by the second lateral drain of the first MagFET.

19. The method described in claim 18 wherein a voltage difference between a center drain and the gate of the second MagFET is configured to be substantially equal to a voltage difference between the center drain and the first lateral drain of the second MagFET.

* * * * *